United States Patent [19]

Takahashi

[11] Patent Number: 5,420,814
[45] Date of Patent: May 30, 1995

[54] SMALL SKEW-CLOCKED SYNCHRONOUS SEMICONDUCTOR DEVICE

[75] Inventor: Hiroyuki Takahashi, Tokyo, Japan
[73] Assignee: NEC Corporation, Tokyo, Japan
[21] Appl. No.: 231,472
[22] Filed: Apr. 22, 1994
[30] Foreign Application Priority Data
 Apr. 23, 1993 [JP] Japan .................. 5-096359
[51] Int. Cl.⁶ .............................................. G11C 7/00
[52] U.S. Cl. .................. 365/189.11; 365/233; 326/66
[58] Field of Search .............. 365/189.11, 189.08, 365/189.05, 233; 307/475

[56] References Cited

U.S. PATENT DOCUMENTS

| | | | |
|---|---|---|---|
| 4,583,203 | 4/1986 | Monk | 365/189.11 |
| 4,897,820 | 1/1990 | Shiomi et al. | 365/230.08 |
| 5,287,019 | 2/1994 | Nonaka et al. | 307/475 |
| 5,331,219 | 7/1994 | Nakamura | 365/189.11 |

FOREIGN PATENT DOCUMENTS 61-22785 9/1986 Japan .

Primary Examiner—Joseph A. Popek
Assistant Examiner—Son Dinh
Attorney, Agent, or Firm—Sughrue, Mion, Zinn, Macpeak & Seas

[57] ABSTRACT

In a synchronous semiconductor device, a plurality of input signals having a small amplitude such as an ECL level are converted into a plurality of input signals having a large amplitude such as a CMOS logic level. The large amplitude input signals are held by a plurality of latch circuits and are then supplied to an internal circuit such as a CMOS memory circuit. An ECL level clock signal is converted into CMOS logic level clock signals at a plurality of clock signal conversion circuits. Each of the latch circuits is clocked by the CMOS logic level clock signal generated from one of the clock signal conversion circuits closest thereto.

16 Claims, 15 Drawing Sheets

SMALL SKEW-CLOCKED SYNCHRONOUS SEMICONDUCTOR DEVICE

BACKGROUND OF THE INVENTION

1. Field of the Invention

The present invention relates to a synchronous semiconductor device such as a synchronous complementary metal oxide semiconductor (CMOS) memory device.

2. Description of the Related Art

Recently, in a semiconductor device, in order to reduce a large skew due to the fluctuation of input and output signals, synchronous semiconductor devices have been used.

In a prior art synchronous semiconductor memory device input signals of an emitter-couped logic (ECL) level are held at ECL input latch circuits clocked by an ECL level clock signal, and are supplied to an ECL memory circuit. Output signals of the ECL memory circuit are held at ECL output latch circuits clocked by the ECL level clock signal and are output therefrom. In this prior art ECL memory device, since the ECL level input signals and the ECL level clock signal have a small amplitude such as 0.4 V, the operation speed is large and a skew, i.e., a difference among the input signals or among the output signals is small. This will be later explained in detail.

In the above-mentioned prior art ECL semiconductor memory device, however, since the ECL latch circuits formed by bipolar transistors require a large DC current, one half or one third of the entire power is consumed in the ECL latch circuits. Also, the layout patterns of the ECL latch circuits are large, so the integration of the device is reduced.

In another prior art synchronous semiconductor memory device, input signals of an ECL level are converted into input signals of a CMOS logic level. Then, the CMOS logic level input signals are held at CMOS input latch circuits clocked by a CMOS logic level clock signal, and are supplied to a CMOS memory circuit. Output signals of the CMOS memory circuit are held at CMOS output latch circuits clocked by the CMOS logic level clock signal and are output therefrom. In this prior art CMOS memory device, since the input and output CMOS latch circuits require no DC current, the power consumption can be reduced. Also, since the layout patterns of the CMOS latch circuits are relatively small, the integration of the device is improved (see: JP-A-61-227285). This will be explained later in detail.

In the above-mentioned prior art CMOS synchronous semiconductor memory device, however, since the CMOS logic level clock signals which have a large amplitude such as 2.5 V are supplied via long paths to the input CMOS latch circuits, a large difference in operation speed generated among the input CMOS latch circuits, i.e., a large skew, is generated, so that the set timing and holding characteristics of the CMOS input signals are deteriorated. Also, since the propagation speed of the CMOS logic level signal having a large amplitude on the long paths is low, the operation speed of the device is also reduced.

SUMMARY OF THE INVENTION

It is an object of the present invention to provide a synchronous semiconductor device having a small skew and a high speed.

According to the present invention, in a synchronous semiconductor device, a plurality of input signals having a small amplitude such as an ECL level are converted into a plurality of input signals having a large amplitude such as a CMOS logic level. The large amplitude input signals are held by a plurality of latch circuits and are then supplied to an internal circuit such as a CMOS memory circuit. An ECL level clock signal is converted into CMOS logic level clock signals at a plurality of clock signal conversion circuits. Each of the latch circuits is clocked by the CMOS logic level clock signal generated from one of the clock signal conversion circuits closest thereto. As a result, the skew of the CMOS logic level clock signal supplied to the latch circuits can be reduced. Also, the propagation path of the CMOS logic level clock signal can be reduced, to thereby enhance the operation speed of the device.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art synchronous semiconductor devices will be explained with reference to FIGS. 1 through 8.

Figure 1:
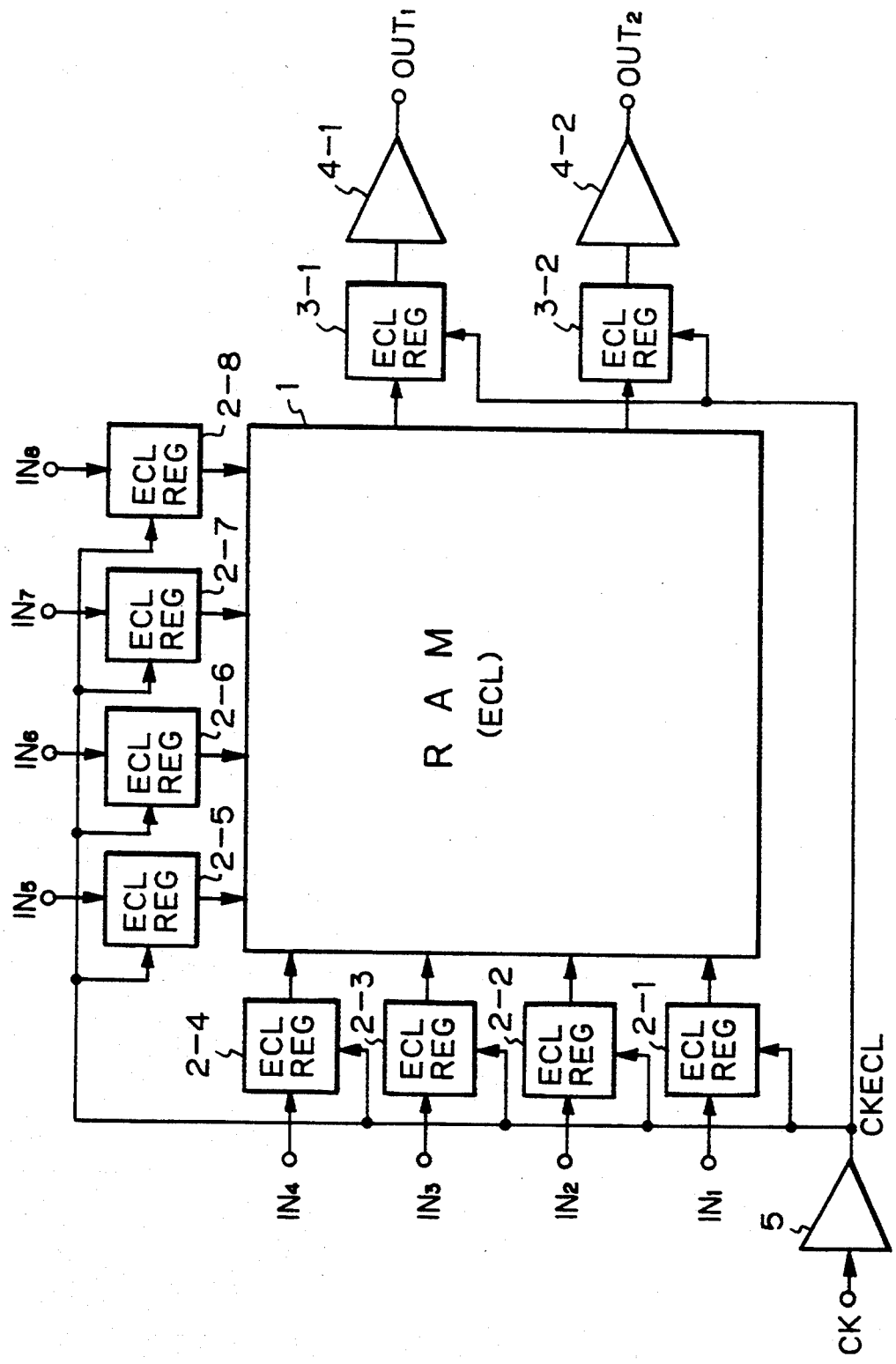
FIG. 1 is a block diagram illustrating a prior art synchronous ECL semiconductor memory device.

In FIG. 1, which illustrates a prior art ECL semiconductor memory device, reference numeral 1 designates an ECL random access memory (RAM) circuit. Input signals $IN_1$ through $IN_8$ of an ECL level such as address signals, control signals and the like are supplied via ECL registers (latch circuits) 2-1 through 2-8, respectively, to the ECL memory circuit 1. On the other hand, output signals of the ECL memory circuit 1 are supplied via ECL registers (latch circuits) 3-1 and 3-2 respectively, to output buffer 4-1 and 4-2, which generate output signals $OUT_1$ and $OUT_2$ of an ECL level. In this case, the ECL registers 2-1 through 2-8, 3-1 and 3-2 are clocked by a clock signal CKECL of an ECL level generated from a clock signal buffer 5 which receives a clock signal of an ECL level.

Figure 2:
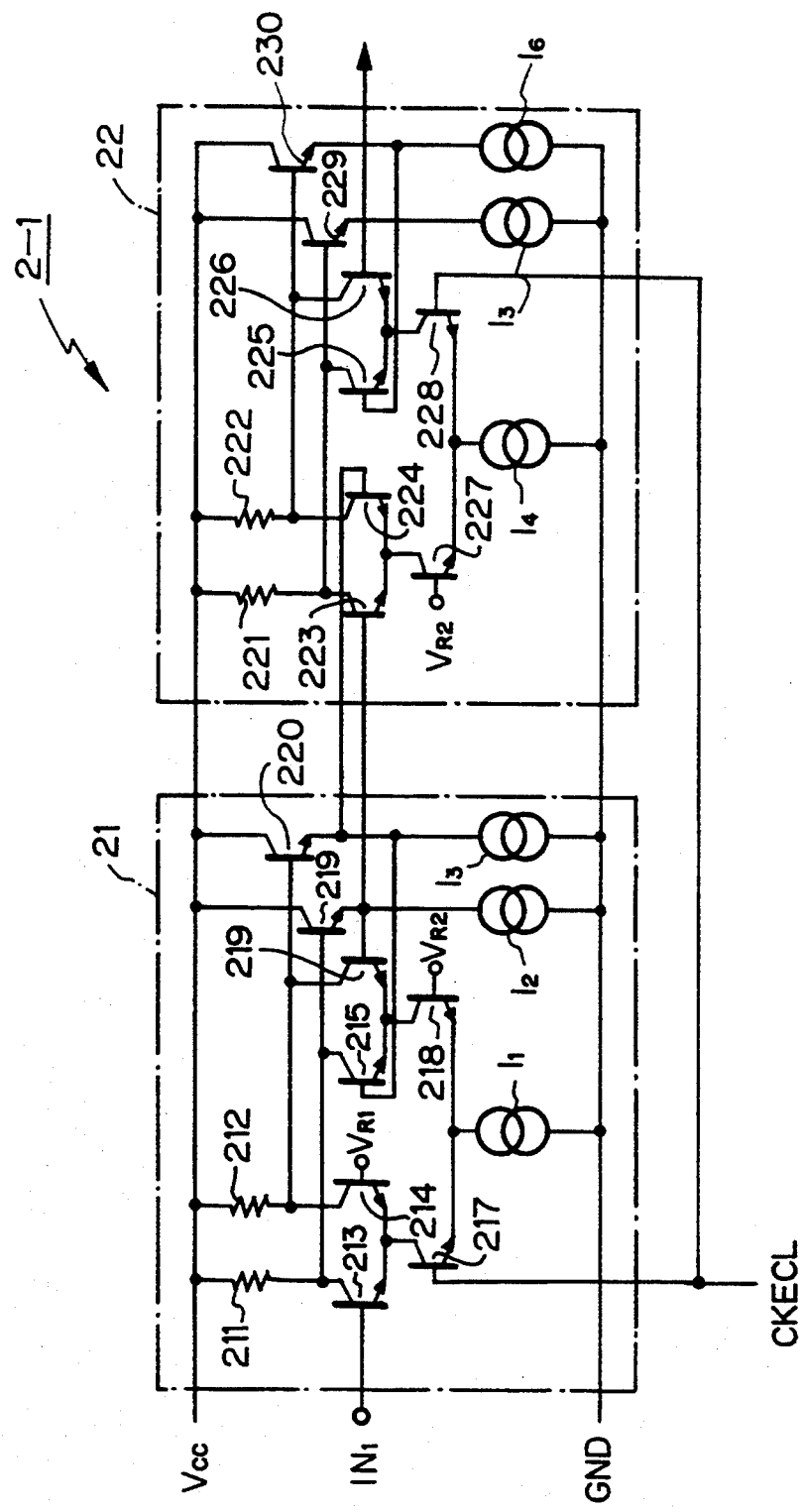
FIG. 2 is a circuit diagram of the ECL register of FIG. 1.

In FIG. 2, which is a detailed circuit diagram of one of the ECL registers, for example, 2-1, this ECL register is formed by a master portion 21 and a slave portion 22. The master portion 21 includes two resistors 211 and 212, NPN-type bipolar transistors 213 through 220, and current sources $I_1$ through $I_3$. In this case, the transistors 217 and 218 form a current switch with respect to the current source $I_1$. When $CKECL > V_{R2}$, so that the transistors 217 and 218 are turned ON and OFF, respectively, the transistors 213 and 214 form a current switch with the current source $I_1$. In this case, one of the transistors 213 and 214 is turned ON and the other is turned OFF in response to whether or not $IN_1 > V_{R1}$. Conversely, when $CKECL < V_{R2}$, so that the transistors 217 and 218 are turned OFF and ON, respectively, the transistors 215 and 216 form a current switch with the current source $I_1$. As a result, the state of the current switch formed by the transistors 213 and 214 moves to the current switch formed by the transistors 215 and 216, so that the input signal $IN_1$ is latched in the master portion 21. Similarly, the slave portion 22 includes two resistors 221 and 222, NPN-type bipolar transistors 223 through 230, and current sources $I_4$ through $I_6$. In this case, the transistors 227 and 228 form a current switch with respect to the current source $I_4$. When $CKECL < V_{R2}$, so that the transistors 227 and 228 are turned ON and OFF, respectively, the transistors 223 and 224 form a current switch with the current source $I_4$. In this case, one of the transistors 223 and 224 is turned ON and the other is turned OFF in response to the outputs of the master portion 21. Conversely, when $CKECL > V_{R2}$, so that the transistors 227 and 228 are turned OFF and ON, respectively, the transistors 225 and 226 form a current switch with the current source $I_4$. As a result, the state of the current switch formed by the transistors 223 and 224 moves to the current switch formed by the transistors 225 and 226, so that the outputs of the master portion 21 are latched in the slave portion 22.

Note that the other ECL registers 2-2 through 2-8, 3-1 and 3-2 have the same configuration as shown in FIG. 2.

Figure 3:
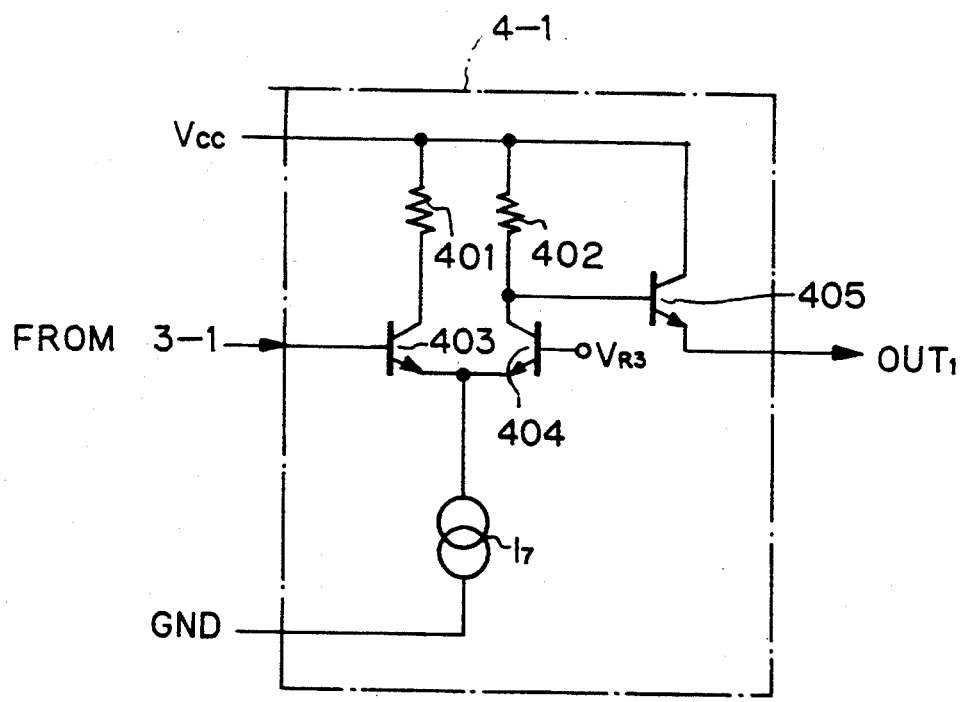
FIG. 3 is a circuit diagram of the output buffer of FIG. 1.

In FIG. 3, which is a detailed circuit diagram of the output buffer such as 4-1 of FIG. 1, this output buffer includes two resistors 401 and 402, NPN-type bipolar transistors 403, 404 and 405, and a current source $I_7$. In this case, the transistors 403 and 404 form a current switch with respect to the current source $I_7$. That is, when the output of the ECL memory circuit 1 is higher than $V_{R3}$, the transistors 403 and 404 are turned ON and OFF, respectively, and the output signal $OUT_1$ becomes high. Conversely, when the output of the ECL memory circuit 1 is lower than $V_{R3}$, the transistors 403 and 404 are turned OFF and ON, respectively, and the output signal $OUT_1$ becomes low.

Figure 4:
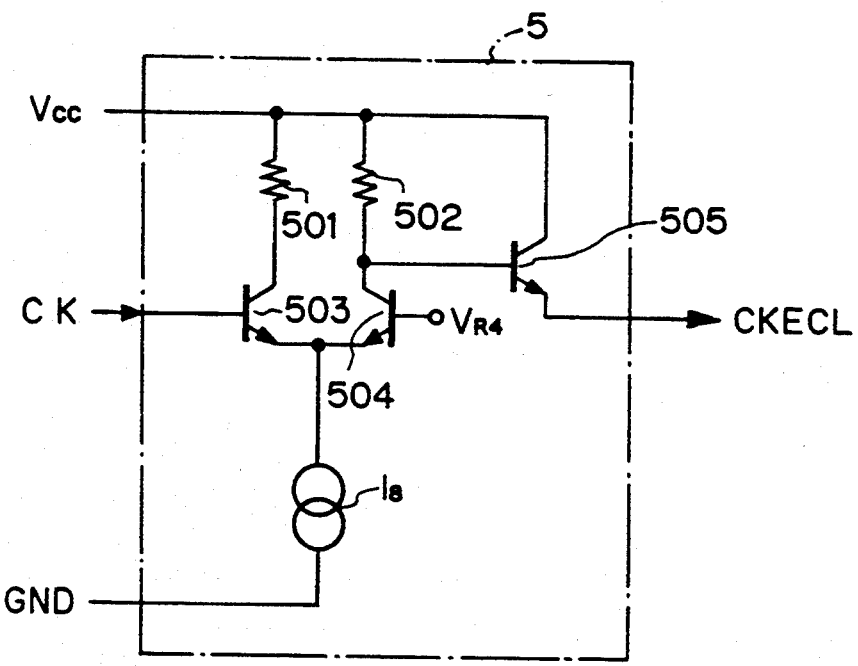
FIG. 4 is a circuit diagram of the clock signal buffer of FIG. 1.

In FIG. 4, which is a detailed circuit diagram clock signal buffer 5 of FIG. 1, this clock signal buffer includes two resistors 501 and 502, NPN-type bipolar transistors 503, 504 and 505, and a current source $I_8$. In this case, the transistors 503 and 504 from a current switch with respect to the current source $I_8$. That is, when a clock signal CK is higher than $V_{R4}$, the transistors 503 and 504 are turned ON and OFF, respectively, and the clock signal CKECL becomes high. Conversely, when the clock signal CK is lower than $V_{R4}$, the transistors 503 and 504 are turned OFF and ON, respectively, and the clock signal CKECL becomes low.

In the ECL synchronous semiconductor memory device of FIGS. 1, 2, 3 and 4, however, since each of the ECL registers includes current sources such as $I_1$ through $I_6$ which require DC currents, the power consumption is very large. In addition, since each of the ECL registers includes a large number of elements, the integration of the device is reduced.

Figure 5:
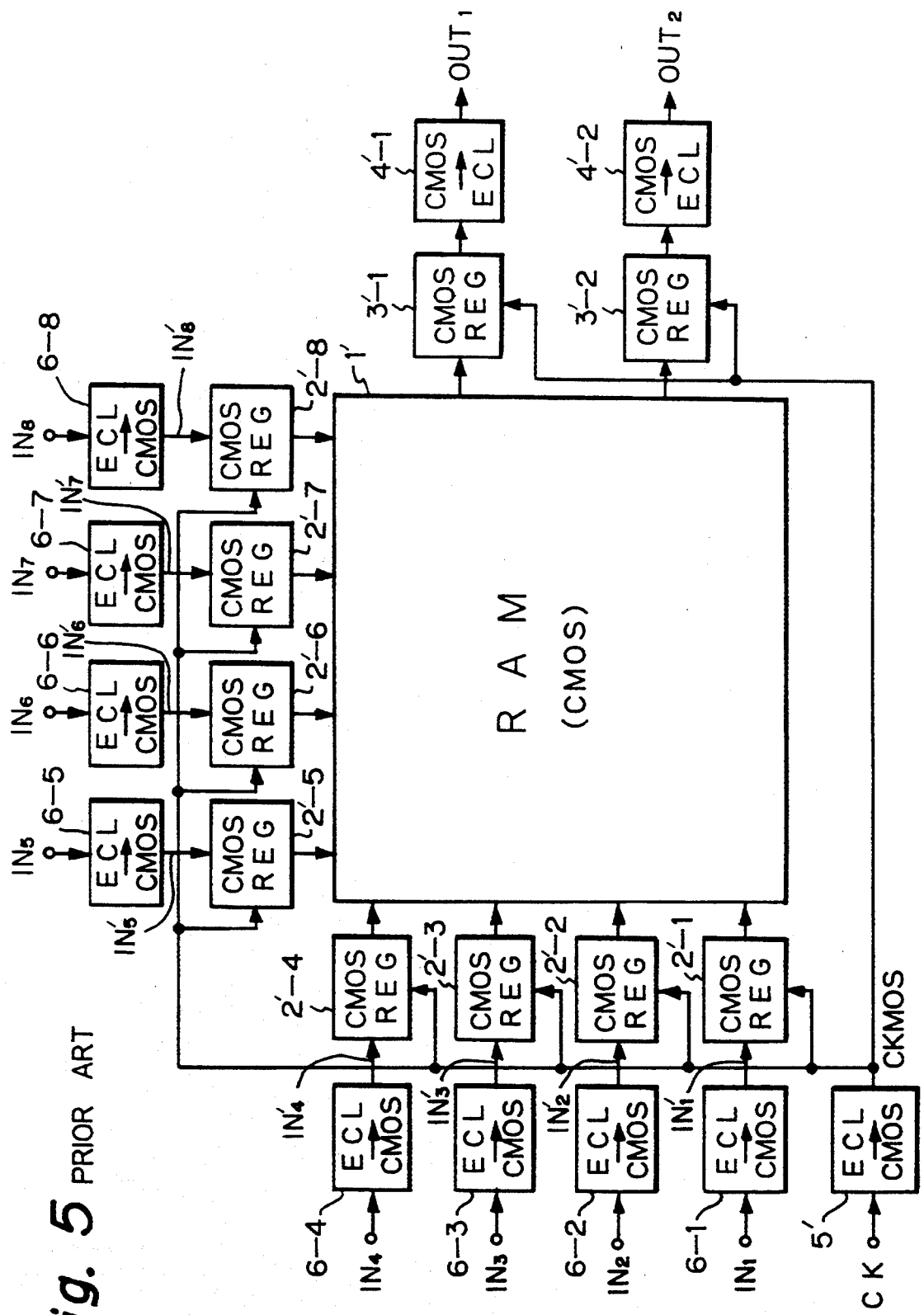
FIG. 5 is a block diagram illustrating a prior art synchronous CMOS semiconductor memory device.

In FIG. 5, which illustrates a prior art CMOS semiconductor memory device, reference 1' designates a CMOS RAM circuit. CMOS registers 2'-1 through 2'-8, 3'-1 and 3'-2 are provided instead of the ECL registers 2-1 through 2-8, 3-1 and 3-2 of FIG. 1. Therefore, the input signals $IN_1$ through $IN_8$ of an ECL level are converted by ECL to CMOS level conversion circuits 6-1 through 6-8 into input signals $IN_1'$ through $IN_8'$. Also, CMOS to ECL level conversion circuits 4'-1 and 4'-2 are provided instead of the output buffers 4-1 and 4-2 of FIG. 1.

The CMOS registers 2'-1 through 2'-8, 3'-1 and 3'-2 are clocked by a CMOS logic level clock signal CKMOS which is generated from an ECL to CMOS level conversion circuit 5' which receives the ECL level clock signal CK.

Figure 6:
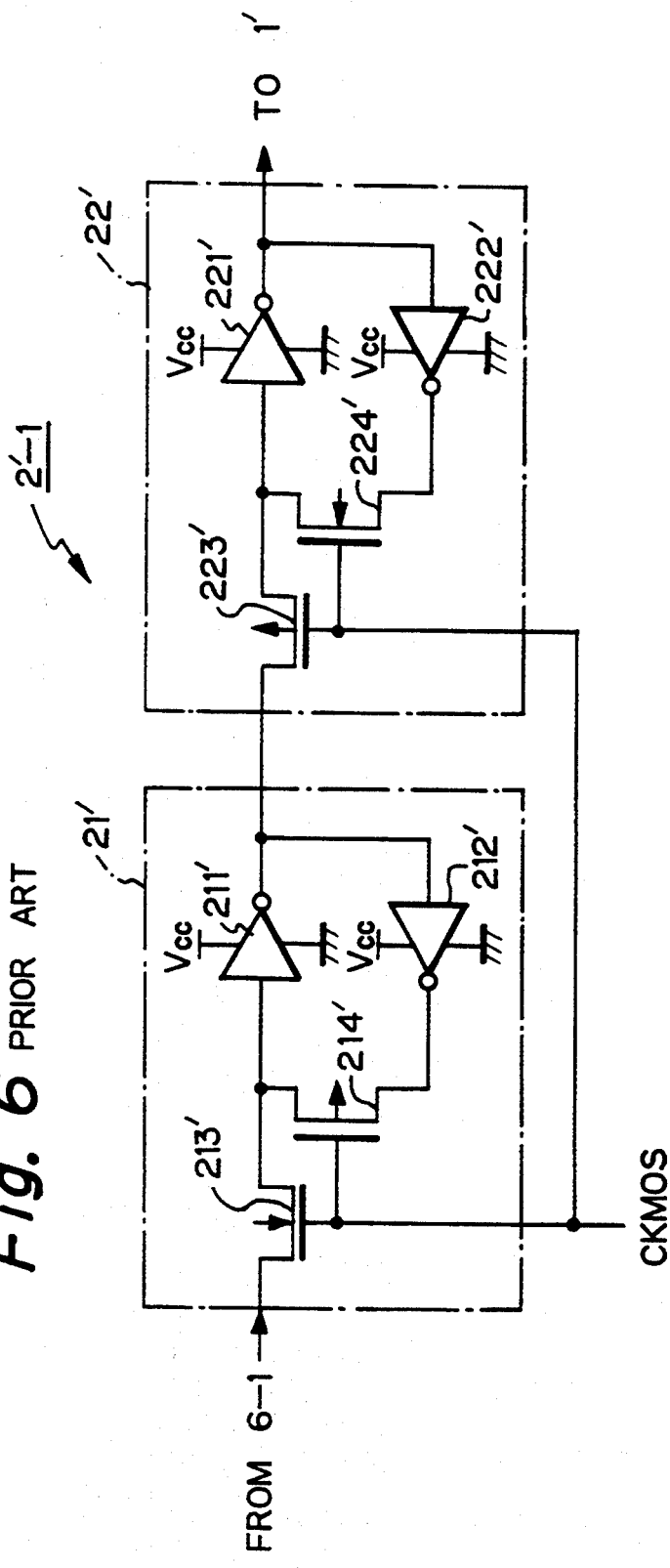
FIG. 6 is a circuit diagram of the CMOS register of FIG. 5.
Figure 6:
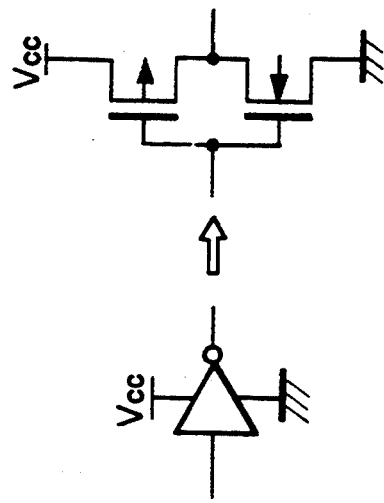

In FIG. 6, which is a detailed circuit diagram of the CMOS register, for example, 2'-1 of FIG. 5, this CMOS register is formed by a master portion 21' and a slave portion 22'. The master portion 21' includes two CMOS inverters 211' and 212', an N-channel MOS transistor 213' and a P-channel MOS transistor 214'. That is, when the clock signal CKMOS is high, the transistors 213' and 214' are turned ON and OFF, respectively, so that the output signal of the ECL to CMOS level conversion circuit 6-1 is supplied via the transistor 213' to the inverter 211'. Then, when the clock signal CKMOS is low, the transistors 213' and 214' are turned OFF and ON, respectively, the output signal of the ECL to CMOS level conversion circuit 6-1 is latched in the inverters 211' and 212' of the master portion 21'. Similarly, the slave portion 22' includes two CMOS inverters 221' and 222', a P-channel MOS transistor 223' and an N-channel MOS transistor 224'. That is, when the clock signal CKMOS is low, the transistors 223' and 224' are turned ON and OFF, respectively, so that the output signal of the master portion 21' is supplied via the transistor 223' to the inverter 221'. Then, when the clock signal CKMOS is high, the transistors 223' and 224' are turned OFF and ON, respectively, so that the output signal of the master portion 21' is latched in the inverters 221' and 222' of the slave portion 22'.

Note that the other CMOS registers 2'-2 through 2'-8, 3'-1 and 3'-2 have the same configuration of the CMOS register 2'-1.

Figure 7:
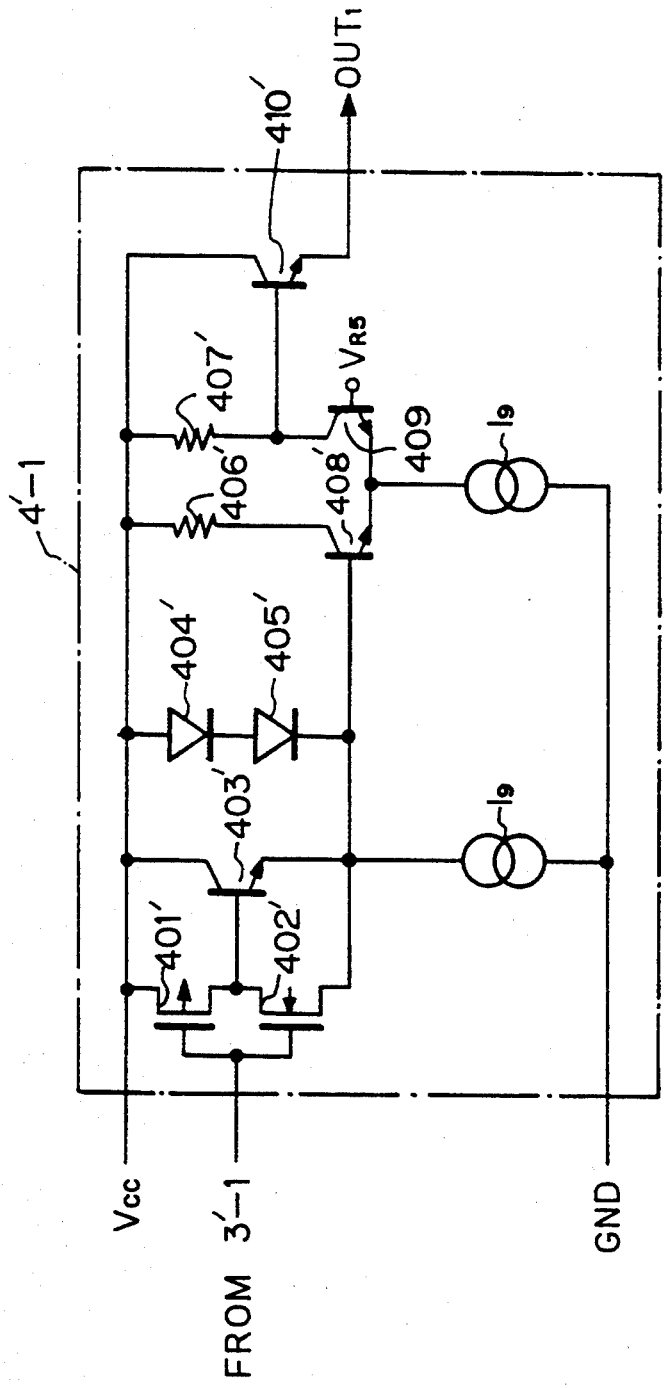
FIG. 7 is a circuit diagram of the CMOS to ECL conversion circuit of FIG. 5.

In FIG. 7, which is a detailed circuit diagram of the CMOS to ECL level conversion circuit, for example, 4'-1, of FIG. 5, this CMOS to ECL level conversion circuit includes an inverter formed by a P-channel MOS transistor 401', an N-channel MOS transistor 402', an NPN-type bipolar transistor 403', diodes (collector-base connected transistors) 404' and 405', a current source $I_9$, resistors 406' and 407', NPN-type bipolar transistors 408', 409' and 410', and a current source $I_9$. In this case, the transistors 408' and 409' form a current switch with respect to the current source $I_9$. That is, when the output of the CMOS register 3'-1 is high, the transistors 401' and 402' are turned OFF and ON, respectively, so as to turn OFF the transistor 403', so that the base potential at the transistor 408' defined by the two diodes 404' and 405' is lower than $V_{R5}$. As a result, the transistors 408' and 409' are turned OFF and ON, respectively, and therefore, the output signal $OUT_1$ becomes high. Conversely, when the output of the CMOS register 3'-1 is low, the transistors 401' and 402' are turned ON and OFF, respectively, so as to turn ON the transistor 403', so that the base potential at the transistor 408' defined by the transistor 403' or one diode is higher than $V_{R5}$. As a result, the transistors 408' and 409' are turned ON and OFF, respectively, and therefore, the output signal $OUT_1$ becomes low.

Figure 8:
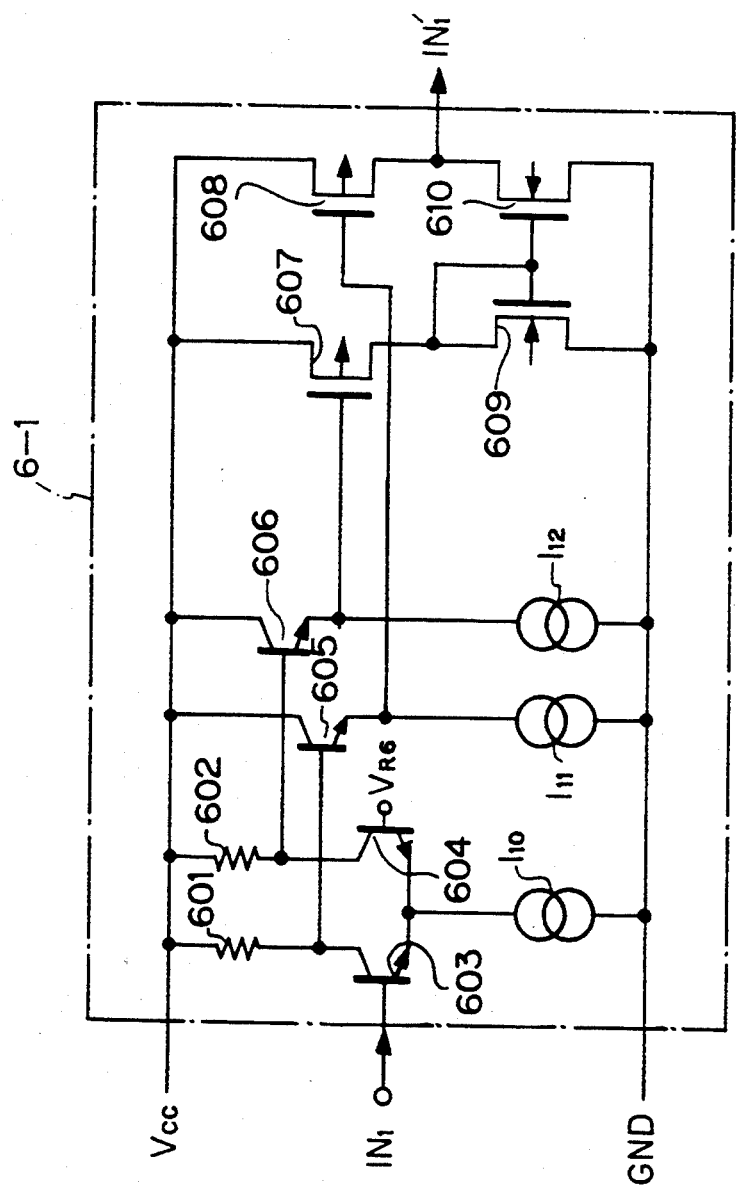
FIG. 8 is a circuit diagram of the ECL to CMOS level conversion circuit of FIG. 5.

In FIG. 8, which is a detailed circuit diagram of the ECL to CMOS level conversion circuit, for example, 6-1 of FIG. 5, this ECL to CMOS level conversion circuit includes resistors 601 and 602, NPN-type bipolar transistors 603 through 606, current sources $I_{10}$, $I_{11}$ and $I_{12}$, P-channel MOS transistors 607 and 608, and N-channel MOS transistors 609 and 610. In this case, the transistors 603 and 604 form a current switch with respect to the current source $I_{10}$. Also, the transistors 609 and 610 form a current mirror circuit. That is, when the ECL level input signal $IN_1$ is higher than $V_{R6}$, the transistors 603 and 604 are turned ON and OFF, respectively, so that the base potentials, i.e., the emitter potentials at the transistors 605 and 606 are low and high, respectively. Therefore, the of the conductances of the transistors 607 and 608 are low and high, respectively, so that the CMOS logic level input signal $IN_1'$ is high. Conversely, when the ECL level input signal $IN_1$ is lower than $V_{R6}$, the transistors 603 and 604 are turned OFF and ON, respectively, so that the base potentials, i.e., the emitter potentials at the transistors 605 and 606 are high and low, respectively. Therefore, the conductances of the transistors 607 and 608 are high and low, respectively, so that the CMOS logic level input signal $IN_1'$ is low.

Note that the other ECL to CMOS level conversion circuits 6-2 through 6-8 and 5' have the same configuration as the ECL to CMOS level conversion circuit 6-1.

Thus, in the prior art CMOS semiconductor memory device of FIGS. 5, 6, 7 and 8, since use is made of CMOS circuits, the power consumption can be small. Also, since each of the CMOS registers includes a small number of elements, the integration of the device can be enhanced.

In the prior art CMOS semiconductor memory device of FIGS. 5, 6, 7 and 8, however, since paths or connections between the ECL to CMOS level conversion circuit 5' and each of the CMOS registers 2'-1 through 2'-8 are different from each other, the set up timings and holding timings of the CMOS registers 2'-1 through 2'-8 are greatly fluctuated due to the low propagation speed caused by the large amplitude of the CMOS logic level clock signal CKMOS. That is, a large skew is generated among the CMOS registers 2'-1 through 2'-8. Also, since the propagation speed of the CMOS logic level clock signal CKMOS is low, and the two stages of the level conversion circuits are provided, the operation speed of the device is reduced.

Figure 9:
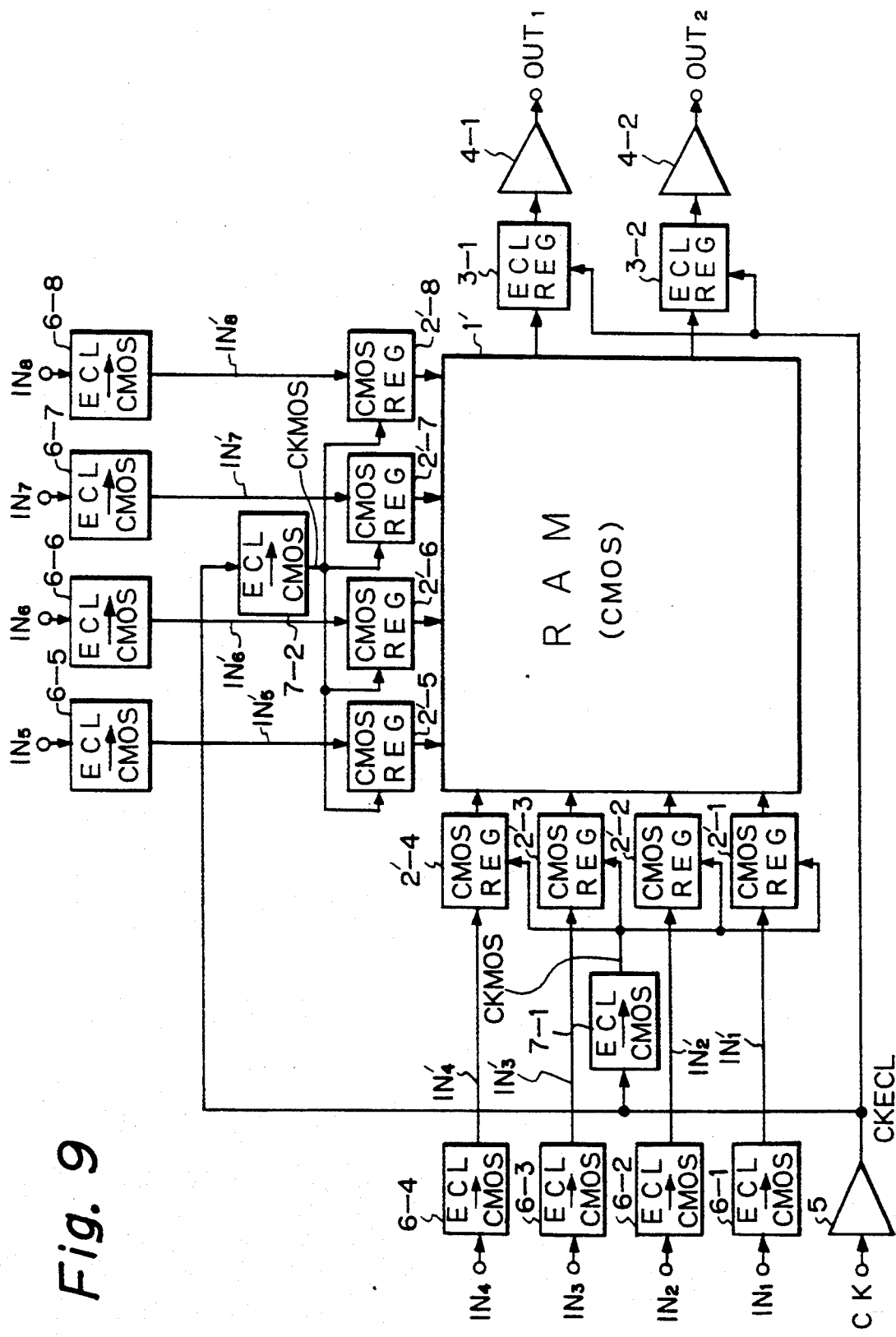
FIG. 9 is a block circuit diagram illustrating a first embodiment of the semiconductor device according to the present invention.

In FIG. 9, which illustrates a first embodiment of the present invention, the clock signal buffer 5 is provided instead of the ECL to CMOS level conversion circuit 5' of FIG. 5. Also, an ECL to CMOS level conversion circuit 7-1 as a clock signal conversion circuit is provided close to the CMOS registers 2'-1 through 2'-4, and an ECL to CMOS level conversion circuit 7-2 as a clock signal conversion circuit is provided close to the CMOS registers 2'-5 through 2'-8. Further, the output portion is the same as that of the device as illustrated in FIG. 1.

In FIG. 9, the ECL clock signal CKECL having a large propagation speed due to the small amplitude is delivered along long connections to the ECL to CMOS level conversion circuits 7-1 and 7-2 close to the CMOS registers 2'-1 through 2'-8. Then, the ECL clock signal CKECL is converted into the CMOS logic level clock signal CKMOS having a small propagation speed due to the large amplitude by the ECL to CMOS level conversion circuits 7-1 and 7-2 close to the CMOS registers 2'-1 through 2'-8 which are clocked by the CMOS logic level clock signal CKMOS. Note that a set up timing of the input signals is determined by the largest speed CMOS register and a hold up timing is determined by the smallest speed CMOS register. Therefore, in FIG. 9, since the ECL level clock signal is sent to portions immediately adjacent to the CMOS registers, the set up timing and holding timing characteristics can be improved in the same way as in the device of FIG. 1. In addition, since a CMOS configuration is adopted, the power consumption of the device can be improved in the same way as in the device of FIG. 5.

That is, in FIG. 9, there are two kinds of clock signal generators, i.e., the clock signal buffer 5 and the ECL to CMOS level conversion circuits 7-1 and 7-2. Also, a connection between the clock signal buffer 5 and the ECL to CMOS level conversion circuits 7-1 and 7-2 is longer than each connection between the ECL to CMOS level conversion circuits 7-1 and 7-2 and the CMOS registers 2'-1 to 2'-8.

Note that, since one ECL to CMOS conversion circuit as the clock signal level conversion circuit is provided for each group of the CMOS registers, for example, four CMOS registers, the presence of such ECL to CMOS level conversion circuits hardly affects the integration of the device.

In FIG. 9, as explained above, the output portion uses ECL circuits. Generally, the number of input terminals is much larger than that of output terminals. For example, the number of input terminals is 3 to 10 times that of output terminals. Therefore, the power dissipated in the output portion is too small to affect the overall power consumption. Also, since the amplitude of the output signals of the CMOS memory circuit 1' is usually of an order of 10 to 100 mV, these output signals can be read out by the ECL circuits.

Figure 10:
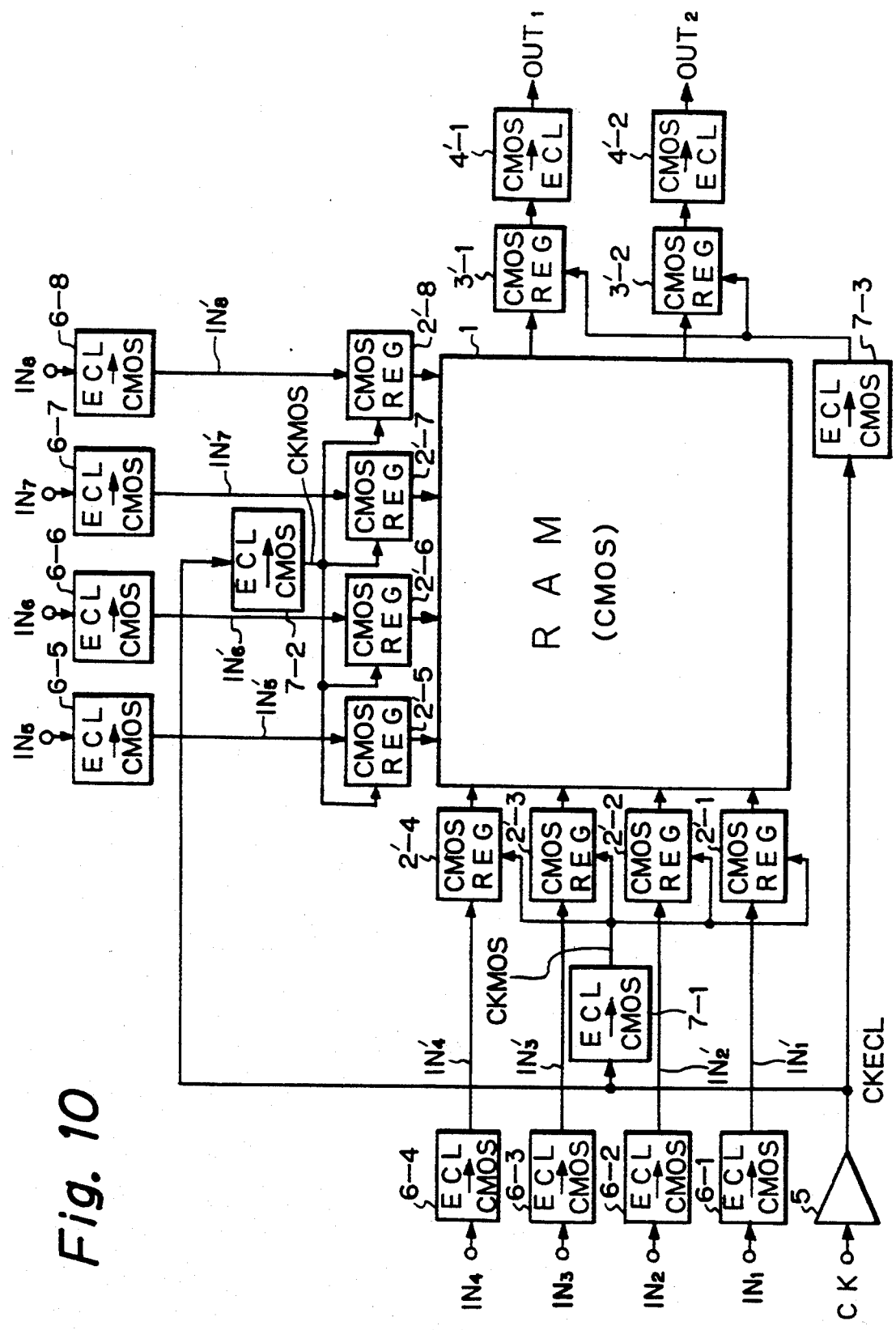
FIG. 10 is a block circuit diagram illustrating a second embodiment of the semiconductor device according to the present invention.

In FIG. 10, which illustrates a second embodiment of the present present invention, it is assumed that the amplitude of the output signals of the memory circuit 1' is relatively large. In this case, the CMOS registers 3'-1 and 3'-2 and the CMOS to ECL level conversion circuits 4'-1 and 4'-2 of FIG. 5 are provided instead of the ECL registers 3-1 and 3-2 and the output buffers 4-1 and 4-2 of FIG. 9. In this case, an ECL to CMOS level conversion circuit 7-3 as a clock signal level conversion circuit is provided between the clock signal buffer 5 and the CMOS registers 3'-1 and 3'-2, and are close to the CMOS registers 3'-1 and 3'-2.

Figure 11:
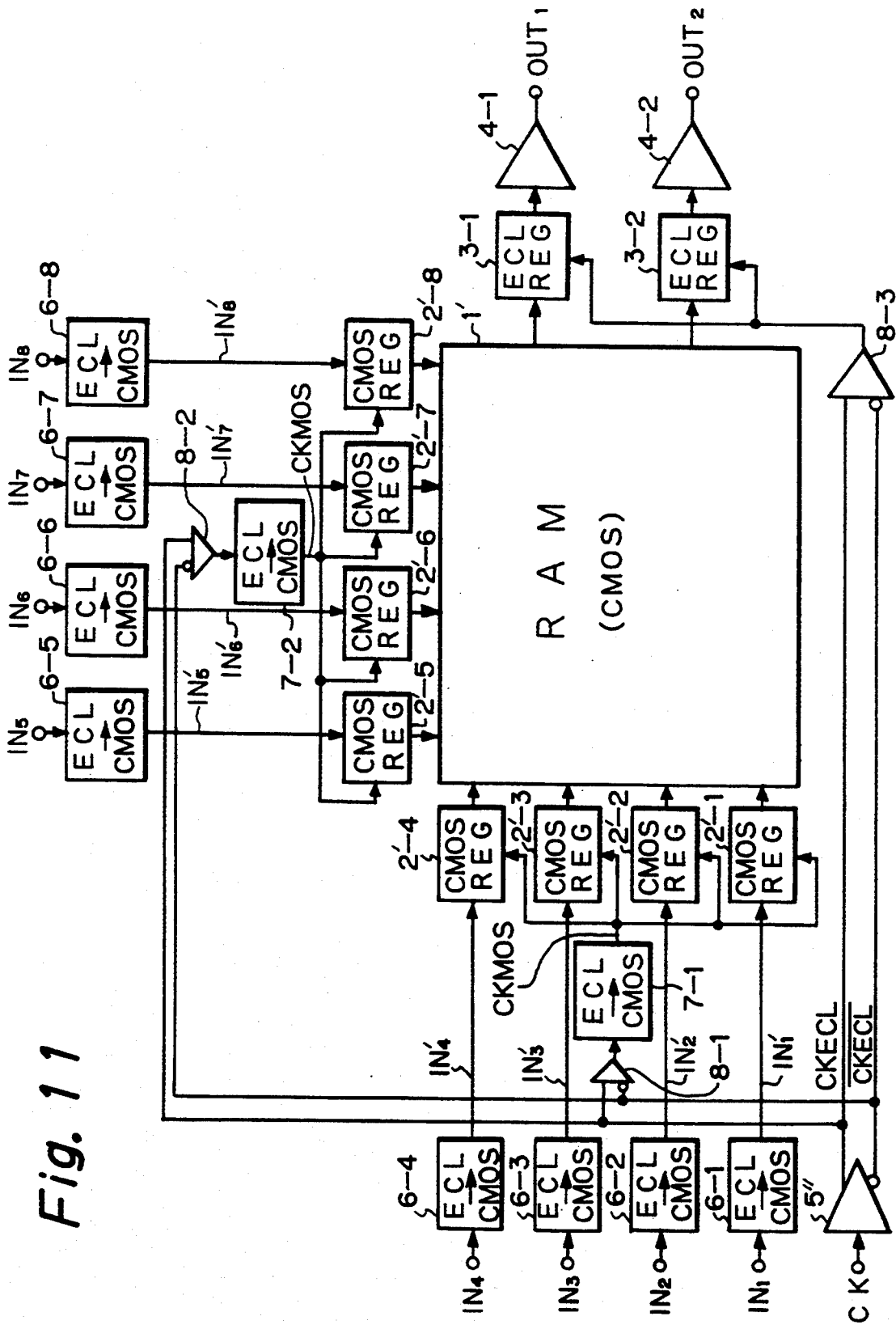
FIG. 11 is a block circuit diagram illustrating a third embodiment of the semiconductor device according to the present invention.

In FIG. 11, which illustrates a third embodiment of the present invention, a clock signal buffer 5" is provided instead of the clock signal buffer 5 of FIG. 9, and differential buffers 8-1, 8-2 and 8-3 are added to the elements of the device of FIG. 9. In this case, the differential buffers 8-1 and 8-2 are close to the ECL to CMOS level conversion circuits 7-1 and 7-2, respectively, and the differential buffer 8-3 is close to the ECL registers 3-1 and 3-2. That is, the clock signal buffer 5" generates two differential voltage signals CKECL and $\overline{CKECL}$ opposite in phase to each other, while the differential buffers 8-1, 8-2 and 8-3 receive the two differential voltage signals CKECL and $\overline{CKECL}$ to regenerate the ECL level clock signal CKECL.

Figure 12:
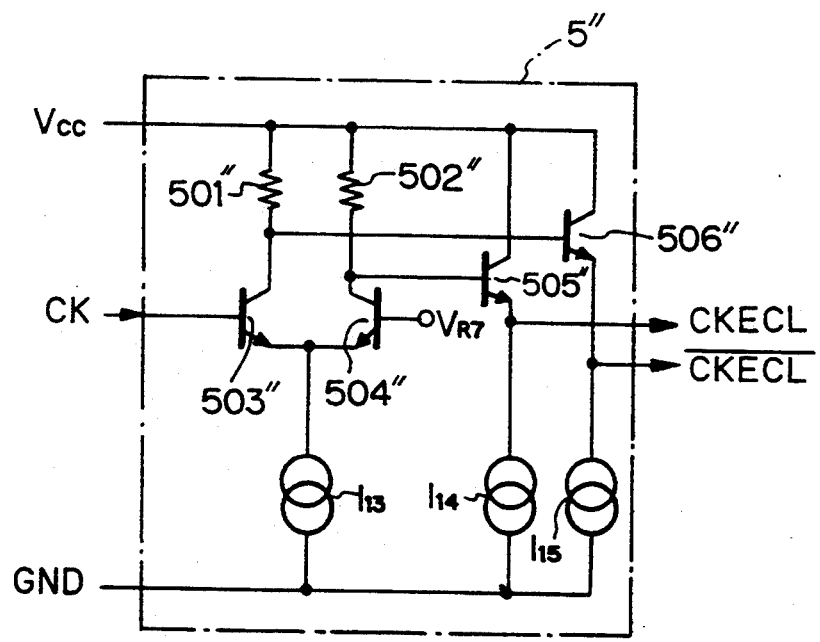
FIG. 12 is a circuit diagram of the clock signal buffer of FIG. 11.

In FIG. 12, which is a detailed circuit diagram of the clock signal buffer 5" of FIG. 11, this clock signal buffer 5" includes resistors 501" and 502", NPN-type bipolar transistors 503" through 506", and current sources $I_{13}$, $I_{14}$ and $I_{15}$. In this case, the transistors 503" and 504" form a current switch with respect to the current source $I_{13}$. That is, when the clock signal CK is higher than $V_{R7}$, the transistors 503" and 504" are turned ON and OFF, respectively, so that the base potentials, i.e., the emitter potentials at the transistors 505" and 506" are high and low, respectively. Therefore, the clock signals CKECL and $\overline{CKECL}$ are high and low, respectively. Conversely, when the clock signal CK is lower than $V_{R7}$, the transistors 503" and 504" are turned OFF and ON, respectively, so that the base potentials, i.e., the emitter potentials at the transistors 505" and 506" are low and high, respectively. Therefore, the clock signals CKECL and $\overline{CKECL}$ are low and high, respectively.

Figure 13:
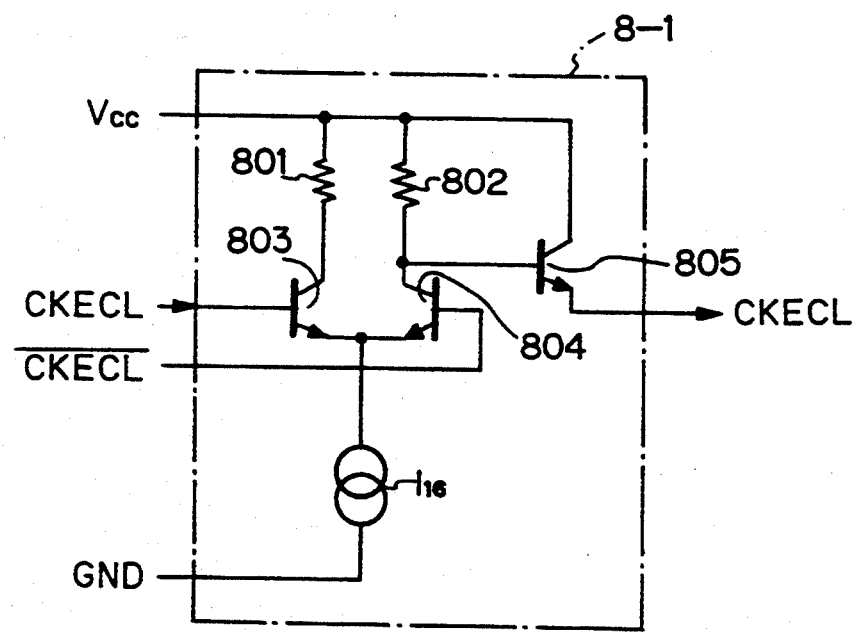
FIG. 13 is a circuit diagram of the driver buffer of FIG. 11.

In FIG. 13, which is a detailed circuit diagram of the differential buffer, for example, 8-1 of FIG. 11, this differential buffer includes two resistors 801 and 802, NPN-type bipolar transistors 803, 804 and 805, and a current source $I_{16}$. In this case, the transistors 803 and 804 from a current switch with respect to the current source $I_{16}$. That is, when CKECL > $\overline{CKECL}$, the transistors 803 and 804 are turned ON and OFF, respectively, the output signal CKECL becomes high. Conversely, when CKECL < $\overline{CKECL}$, the transistors 803 and 804 are turned OFF and ON, respectively, the output signal CKECL becomes low.

Figure 14:
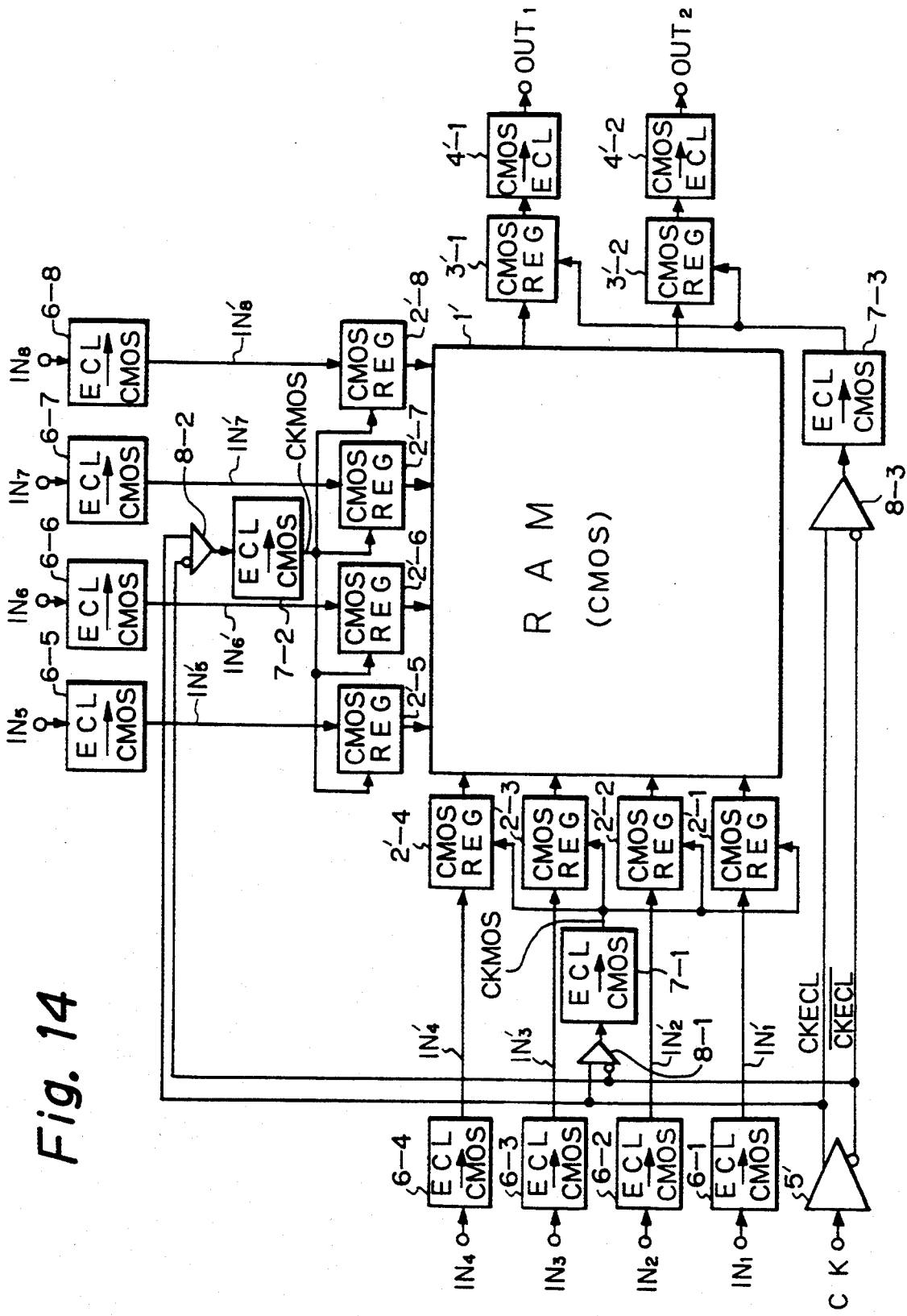
FIG. 14 is a block circuit diagram illustrating a fourth embodiment of the semiconductor device according to the present invention.

In FIG. 14, which illustrates a fourth embodiment of the present invention, the same modification in FIG. 11 is performed upon the device of FIG. 10.

Figure 15A:
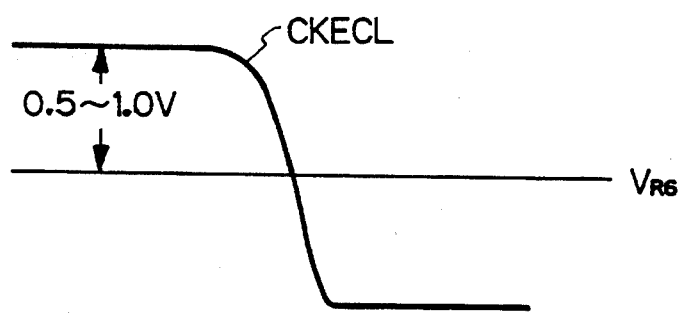
FIGS. 15A and 15B are timing diagrams showing the output signals of the clock signal buffers of FIGS. 9, 10, 11 and 14.
Figure 15B:
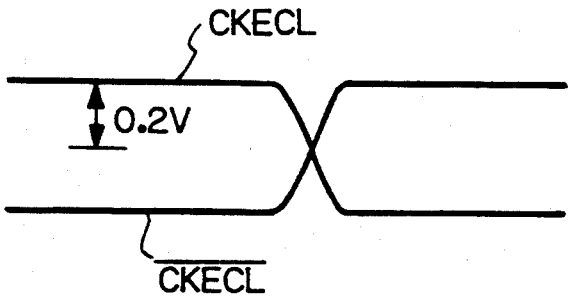

In the first and second embodiments as illustrated in FIGS. 9 and 10, the internal ECL clock signal CKECL is single-phased as shown in FIG. 15A. In this case, the amplitude of the internal ECL clock signal CKECL is relatively large such as 0.5 to 1.0 V. On the other hand, in the third and fourth embodiments as illustrated in FIGS. 11 and 14, the internal ECL clock signals CKECL and $\overline{CKECL}$ are two-phased as shown in FIG. 15B. In this case, the amplitude of the internal ECL clock signals CKECL and $\overline{CKECL}$ is relatively small such as 0.2 V. As a result, the set-up timing and holding timing characteristics can be improved in the third and fourth embodiments as compared with the first and second embodiments.

Figure 16:
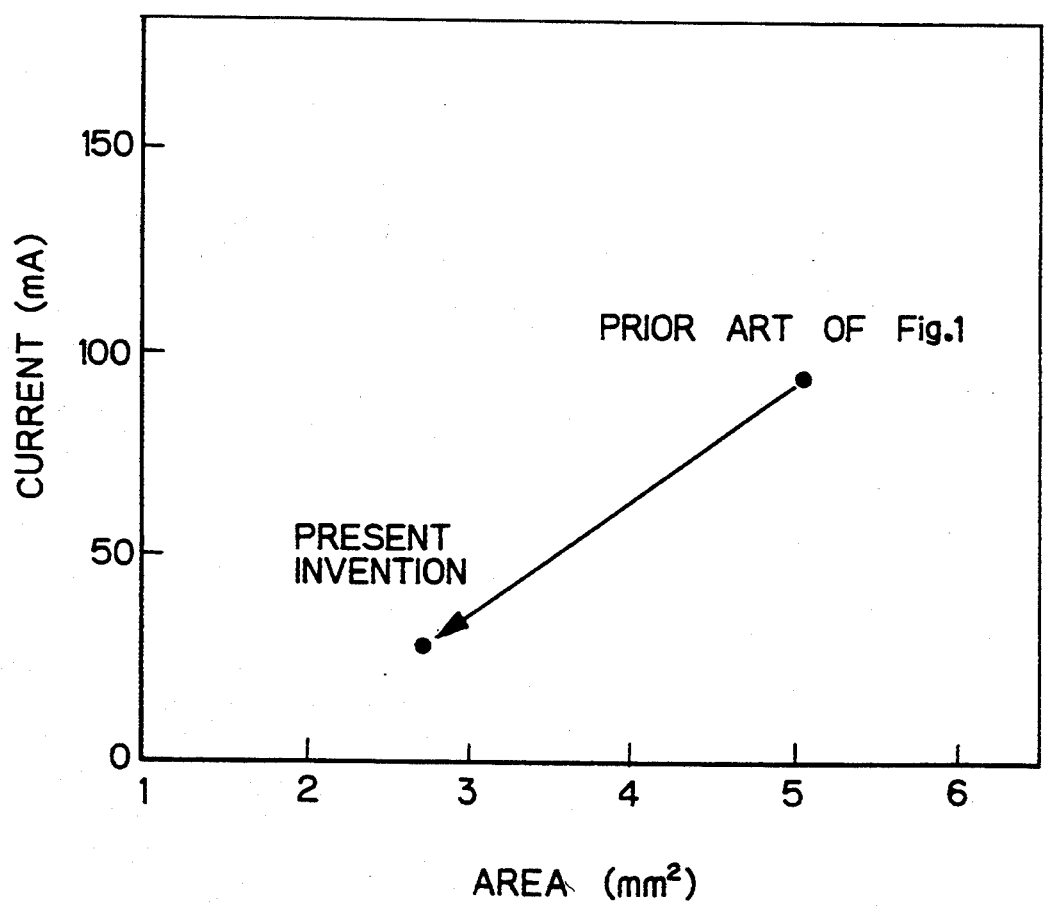
FIGS. 16 and 17 are graphs showing the effect of the present invention.

In FIG. 16, which shows the effect of the present invention, in a 0.6 μm rule 256 Kbit or 1 Mbit Bi-CMOS semiconductor memory device, the area and current of an input portion including the ECL registers using the prior art device of FIG. 1 are about 5.0 mm² and about 100 mA, respectively, while the area and current of an input portion including the ECL to CMOS level conversion circuits and the CMOS registers using the present invention are about 2.7 mm² and about 25 mA, respectively. Thus, the power consumption and integration in the device of the present invention are improved as compared with the prior art as illustrated in FIG. 1.

Figure 17:
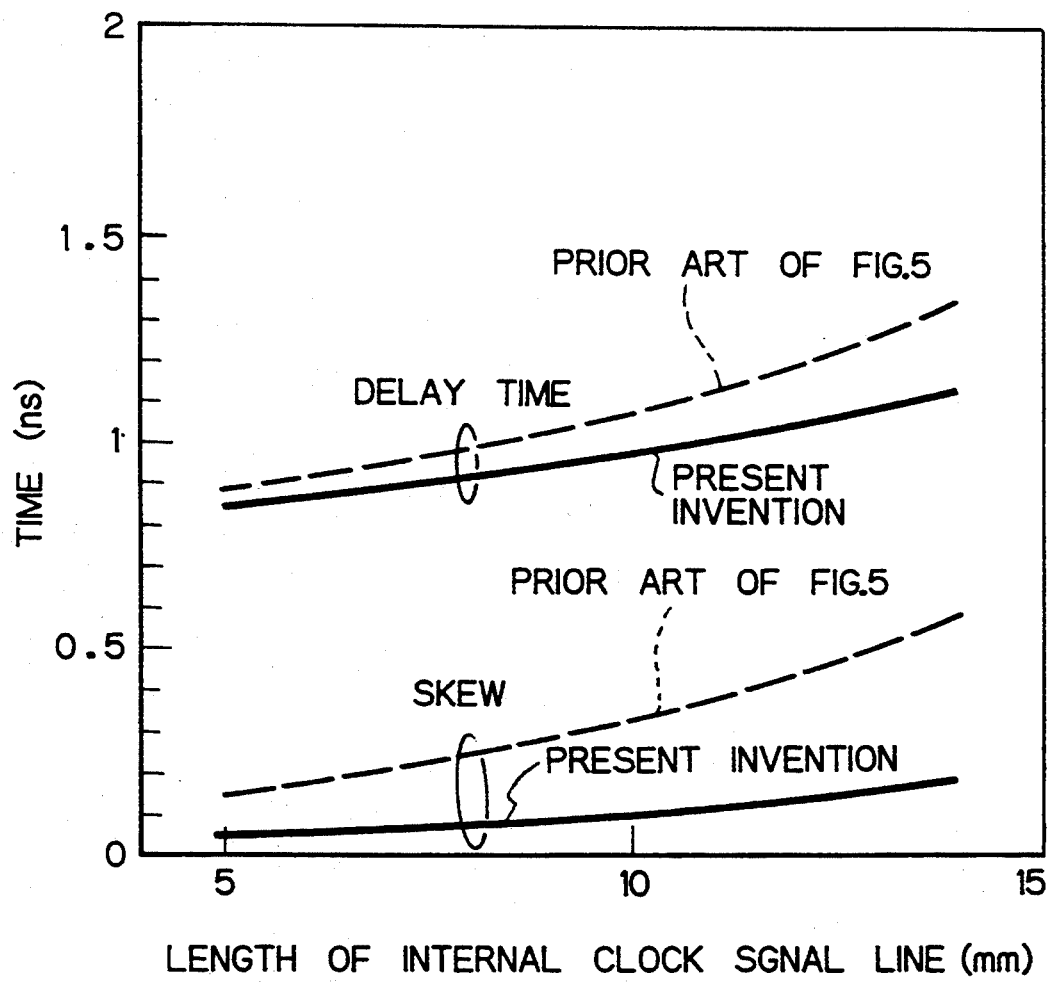

In FIG. 17, which also shows the effect of the present invention, in a 0.6 μm rule 256 Kbit or 1 Mbit Bi-CMOS semiconductor memory device, the delay time (propagation time) and skew of the internal clock signal of the prior art device as illustrated in FIG. 5 is shown by dot lines, while the delay time and skew of the internal clock signal of the present invention is shown by solid lines. Thus, the operation speed is increased by about 10 to 20%, and the skew is reduced by about ⅓. Thus, the operation speed and skew of the device of the present invention are improved as compared with the prior art as illustrated in FIG. 5.

As explained hereinbefore, according to the present invention, the skew and operation speed can be improved.

I claim:
1. A synchronous semiconductor device comprising:
   a clock signal receiving buffer for receiving a clock signal to generate a first clock signal having a first amplitude;
   a plurality of clock signal conversion circuits, connected to said clock signal receiving buffer, for converting the first clock signal into a second clock signal having a second amplitude larger than the first amplitude;
   a plurality of level conversion circuits, each receiving one first input signal having the first amplitude to convert said first input signal into a second input signal having the second amplitude;
   a plurality of input latch circuits, each connected to one of said level conversion circuits, for holding the second input signal thereof, clocked by the second clock signal from one of said clock signal conversion circuits closest to each of said input latch circuits;
   an internal circuit, connected to said input latch circuits;
   a plurality of output latch circuits connected to said internal circuit, clocked by the first clock signal; and
   a plurality of output buffers, each connected to one of said output latch circuits.

2. A device as set forth in claim 1, wherein each of said level conversion circuits is divided into a plurality of groups, and each of said clock signal conversion circuits is in proximity to one of said groups.

3. A device as set forth in claim 1, wherein said first clock signal is formed by two differential voltage signals opposite in phase to each other, said device further comprising a plurality of differential buffers, each connected between said clock signal receiving buffer and one of said clock signal conversion circuits and being close thereto.

4. A device as set forth in claim 1, wherein each of said input latch circuits comprises a master/slave type register.

5. A device as set forth in claim 1, wherein each of said output latch circuits comprises a master/slave type register.

6. A device as set forth in claim 1, wherein said first clock signal and said first input signals are of an ECL level, and said second clock signal and said second input signals are of a CMOS logic level.

7. A device as set forth in claim 1, wherein said internal circuit comprises a CMOS semiconductor memory circuit.

8. A synchronous semiconductor device comprising:
   a clock signal receiving buffer for receiving a clock signal to generate a first clock signal having a first amplitude;
   a plurality of clock signal conversion circuits, connected to said clock signal receiving buffer, for converting the first clock signal into a second clock signal having a second amplitude larger than the first amplitude;
   a plurality of first level conversion circuits, each receiving one first input signal having the first amplitude to convert said first input signal into a second input signal having the second amplitude;
   a plurality of input latch circuits, each connected to one of said first level conversion circuits, for holding the second input signal thereof, clocked by the second clock signal from one of said clock signal conversion circuits closest to each of said input latch circuits;
   an internal circuit, connected to said input latch circuits;
   a plurality of output latch circuits connected to said internal circuit, clocked by the second clock signal from one of said clock signal conversion circuits closest to each of said output latch circuits; and
   a plurality of second level conversion circuits, each connected to one of said output latch circuits, for converting an output signal thereof into an output signal having the first amplitude.

9. A device as set forth in claim 8, wherein each of said first and second level conversion circuits is divided into a plurality of groups, and each of said clock signal conversion circuits is in proximity to one of said groups.

10. A device as set forth in claim 8, wherein said first clock signal is formed by two differential voltage signals opposite in phase to each other,
   said device further comprising a plurality of driver buffers, each connected between said clock signal receiving buffer and one of said clock signal conversion circuits and being close thereto.

11. A device as set forth in claim 8, wherein each of said input latch circuits comprises a master/slave type register.

12. A device as set forth in claim 8, wherein each of said output latch circuits comprises a master/slave type register.

13. A device as set forth in claim 8, wherein said first clock signal and said first input signals are of an ECL level, and said second clock signal and said second input signals are of a CMOS logic level.

14. A device as set forth in claim 8, wherein said internal circuit comprises a CMOS semiconductor memory circuit.

15. A semiconductor device comprising:
   a first clock generator for generating a first level clock signal;
   a second clock generator, connected via a first connection to said first clock generator, for converting the first level clock signal into a second level clock signal;
   data level conversion means for receiving a first level data signal to convert the first level data signal into a second level data signal; and
   data input means, connected to said data level conversion means and via a second connection to said second clock generator, for inputting the second level data signal clocked by the second clock signal,
   said first connection being substantially longer than said second connection.

16. A device as set forth in claim 15, wherein said first level clock signal is of an ECL level and said second level clock signal is of a CMOS level.

* * * * *

UNITED STATES PATENT AND TRADEMARK OFFICE
CERTIFICATE OF CORRECTION

PATENT NO.    : 5,420,814
DATED         : May 30, 1995
INVENTOR(S)   : Hiroyuki TAKAHASHI It is certified that error(s) appears in the above-identified patent and that said Letters Patent is hereby corrected as shown below:

Col. 1, line 18, delete "couped" and insert --coupled--.

Col. 3, line 46, delete "$I_4$" and insert --$I_4$.--.

Col. 4, line 12, delete "from" and insert --form--.

Col. 5, line 46, delete the first occurrence of "of the".

Col. 6, line 5, delete "cansed" and insert --caused--.

Col. 7, line 51, delete "from" and insert --form--.

Signed and Sealed this

Thirtieth Day of January, 1996

Attest:

BRUCE LEHMAN

*Attesting Officer*　　　*Commissioner of Patents and Trademarks*